United States Patent [19]

Go Ang et al.

[11] Patent Number: 5,028,818
[45] Date of Patent: Jul. 2, 1991

[54] GROUND BOUNCE LIMITING DRIVER USING NON-LINEAR CAPACITOR

[75] Inventors: Michael A. Go Ang, Santa Clara; Wingyu Leung, Cupertino, both of Calif.

[73] Assignee: Integrated Device Technology, Inc., Santa Clara, Calif.

[21] Appl. No.: 486,507

[22] Filed: Feb. 28, 1990

[51] Int. Cl.[5] .............................. H03K 6/04
[52] U.S. Cl. .................... 307/443; 307/451; 307/548; 307/246; 307/263
[58] Field of Search ............ 307/443, 451, 546–548, 307/553–554, 246, 263

[56] References Cited

U.S. PATENT DOCUMENTS

| | | | |
|---|---|---|---|
| 4,758,743 | 7/1988 | Dehganpour et al. | 307/443 |
| 4,797,579 | 1/1989 | Lewis | 307/443 |
| 4,857,863 | 8/1989 | Ganger et al. | 307/263 X |
| 4,862,018 | 8/1989 | Taylor et al. | 307/443 |
| 4,906,867 | 3/1990 | Petty | 307/246 X |
| 4,908,528 | 3/1990 | Huang | 307/443 |
| 4,924,115 | 5/1990 | Yazdy | 307/443 |
| 4,931,668 | 6/1990 | Kikuda et al. | 307/263 X |
| 4,973,861 | 11/1990 | Dikken | 307/443 |

Primary Examiner—David Hudspeth
Attorney, Agent, or Firm—Thomas E. Schatzel

[57] ABSTRACT

A ground-bounce limiting circuit comprised of a non-linear Miller capacitance between the drain and the gate of an output driver. Ground-bound is limited by controlling the time-ramping of the output current by continuously diverting the charge at critical times and thresholds on the gate of the output driver which are being delivered by a predriver.

8 Claims, 5 Drawing Sheets

GROUND BOUNCE LIMITING DRIVER USING NON-LINEAR CAPACITOR

BACKGROUND OF THE INVENTION

1. Field of the Invention

The invention relates generally to electronic circuitry and more particularly to digital circuit design techniques in semiconductor devices resulting in the limiting of ground bounce.

2. Description of the Prior Art

CMOS chip suppliers are plagued by momentary undulations of ground (Vss) potential called "ground bounce." Abrupt discharges of large doses of current to ground are attributable to the tremendous pulldown action of output buffers; these buffers sink the charge coming from the output loads through a chip's internal ground path which terminates in an unavoidable series inductance to system ground.

Both faster switching speeds and higher current sinking ability exacerbate ground bounce. Too severe a ground bounce will cause false level transitions in both the driving and driven devices. Less severe ground bounce will decrease noise immunity, because positive ground bounce robs from Voltage Input High (VIH) margins and negative ground bounce cuts into Voltage Input Low (VIL) margins.

Ground bounce effects are sensitive to process, temperature, and operating voltage variations. "Fast" process, low temperature, and high operating voltage each increase ground bounce. Device speed, a dominant parameter, is worst at the opposite extremes: slow process, high temperature, and low operating voltages. Testing for speed receives so much attention at its worst case extremes, that the worst case extremes for ground bounce are often ignored.

Prior art has attempted to correct ground bounce. Each attempt uses a different approach, but all achieve less that a complete solution. Invariably, a common technique employed involves distributing the current running through pulldown devices. Multiple pulldown devices each handle a reduced portion of the whole current and are successively turned on via a delay chain.

Consider the prior art of FIG. 1 discussed in U.S. Pat. No. 4,785,201 by Martinez. The circuit of FIG. 1 uses a P-type Metal Oxide Semiconductor (PMOS) pullup transistor 110 and a N-type Metal Oxide Semiconductor (NMOS) pulldown transistor 112 as a pair of strong driving elements. (The parasitic, but "unavoidable series inductance to system ground" is shown as a discrete inductor 184, and a matching inductor 180 to Vcc.) A PMOS pullup transistor 114 and a NMOS pulldown transistor 116 form a pair of weak driving elements. The weaker pair are designed to turn on prior to the stronger pair via delays introduced by a pair of inverter transistors 118 and 120. The main idea is that the large current spike created when a large lumped device is turned on will be decreased in intensity if a previously activated weaker device dissipates some of the initial discharge energy. The gain of the stronger devices can be slightly lower than would otherwise be required.

The U.S. Pat. No. 4,638,187, Boler et al, suggests the prior art circuit of FIG. 2. The circuit in FIG. 2 differs from that in FIG. 1 in the implementation of the pulldown action. Instead of using a PMOS pulldown as a weaker device, another NMOS pulldown transistor 94 is used instead. This weaker pulldown transistor 94 has a smaller gain than the main NMOS pulldown 96. The delay is introduced by an R-C network that includes a resistor 98 (and stray capacitance), instead of an inverter chain.

The circuit contained in U.S. Pat. No. 4,777,389 by Wu et al is repeated in prior art FIG. 3. This circuit essentially uses the same current distribution of the two examples above, but uses a different method of achieving the delay for the second, stronger pulldown transistor. (The stray inductance-resistance to system ground is shown as discrete devices an inductor L2 and a resistor R2, and a matching pair of an inductor L1 and a resistor R1 to Vcc.) The delay in turning on the second, stronger pulldown transistor results from a closed loop control that waits for the high to low transition of the output on a line 50 to reach a certain level before a pulldown transistor 118 is activated. This assures an adequate time spacing between the two current spikes.

None of the prior art above directly monitor or control the particular electrical parameter that results in ground bounce, namely, the time rate of change of the pulldown current (di/dt). The sensitivities to process, temperature, and operating voltage also go largely neglected.

The prior art of FIG. 4, U.S. Pat. 4,622,482, Ganger, directs itself to limiting the output voltage slew rate in telecommunications applications. Referring to FIG. 4, a pair of fixed capacitors 18 and 32, and a pair of constant current sources 20 and 40, are each used to perform slew rate limiting and to insure linearity.

Several undesirable consequences result from the implementation of FIG. 4. Biasing circuits are required to provide N-bias and P-bias potentials, thereby requiring an accurate source externally and therefore extra I/O pins. Alternatively, internally generated biases would necessitate generators with large static DC currents to sustain a reasonable noise rejection ratio.

In the circuit of FIG. 4 a complementary pair of push-pull transistors 14 and 30 are never mutually exclusive because their gates are not pulled completely up to Vdd or down to Vss when intended to be off. This results in large leakage currents that are usually unacceptable in digital circuits. And since the push-pull transistors 14 and 30 are never quite off, parasitic capacitive coupling in their gates to Vdd and Vss will cause the push-pull transistors 14 and 30 to amplify any high-frequency noise on the Vdd and Vss supply rails.

Slew-rate control is confined only to the saturation region of the output transistors 14 and 30 when static biasing is used. Since the value of capacitors 18 and 32 do not change to accommodate the push-pull transistors 14 and 30 transition from their saturation region to their linear region, the linearity control fails at this stage and throughout the linear region of operation.

The capacitive coupling provided by capacitors 18 and 32 will couple any output transition back to the gate of the supposedly off transistor 14 or 32 to cause it to turn on. While the resulting current contention has the effect of further limiting the voltage slew rate of the output 16, it inadvertently dumps even more transient and DC current to Vss, which actually increases ground bounce in digital circuits.

The circuit of FIG. 5 (which originates from a pending application, Ser. No. 07/300,915, by Leung et al., and assigned to the assignee of the current application) corrects some of the deficiencies of the circuits discussed above. The circuit of FIG. 5 assumes that the current sourced by a pair of transistors 170 and 172 is constant—which it is not. As a result, a superposition of higher order voltage functions of "t" (time) on a line 182 occurs; and that effectively subverts the square-root-of-t relationship that is critical to promoting the proper slew-rate limiting needed to suppress ground bounce.

A transistor 190 in FIG. 5 is supposed to provide additional drive to the gate of a transistor 196. This additional drive is needed to initially boost the voltage on line 182 from zero to VT. But, transistor 190 is switched off too late, because the output of a gate 152 on a line 158, which are connected to the input gate of transistor 190, transitions sometime after the greatest rate of change in the pulldown current has already been reached in transistor 196.

The circuit of FIG. 5 allows a capacitor node, which exists on the gate of the pulldown transistor 196, to charge all the way down to zero, thus inhibiting a jump to VT potential at the onset of the pulldown action of transistor 196. It has been determined that it is of prime importance to have a node, such as line 182, jump to VT potential at the onset of the pulldown action. The VT shift is essential to maintaining an optimum speed to ground bounce ratio, but it is absent in the prior art.

SUMMARY OF THE PRESENT INVENTION

It is therefore an object of the present invention to provide a feedback controlled circuit having controlled ground bounce effects by controlling the time rate of change of the pulldown current.

It is a further object to desensitize ground bounce effects from the effects of process, temperature, and operating voltage.

It is a further object to keep the ground bounce circuitry to a minimum.

It is a further object to minimize the expense of limiting ground bounce.

It is a further object to optimize the speed to ground bounce ratio of circuits employing ground bounce control. This optimization achieves the maximum speed possible with the minimum ground bounce possible.

Briefly, a preferred embodiment includes within a semiconductor device a circuit that will feedback a non-linear control current to the gate of a pulldown device at such times and at such magnitudes that the output waveform is optimally shaped.

An advantage of the present invention is that ground bounce peaks and troughs are effectively clipped and false triggering in associated circuits is reduced or completely eliminated.

Another advantage of the present invention is that the degree of non-linear feedback control applied will track variations in process, temperature, and operating voltage variables. Ground bounce behavior tested at any particular combination of variables can be reasonably expected to typify the whole range of combinations possible-testing is simplified and made more comprehensive at the same time.

Another advantage of the present invention is that overall circuit and system complexity is reduced. The required real estate on the chip is therefore reduced, and costs and yields are improved.

Another advantage of the present invention is the freedom to attain a large output sink current ($I_{OL}$) without exacerbating ground bounce.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
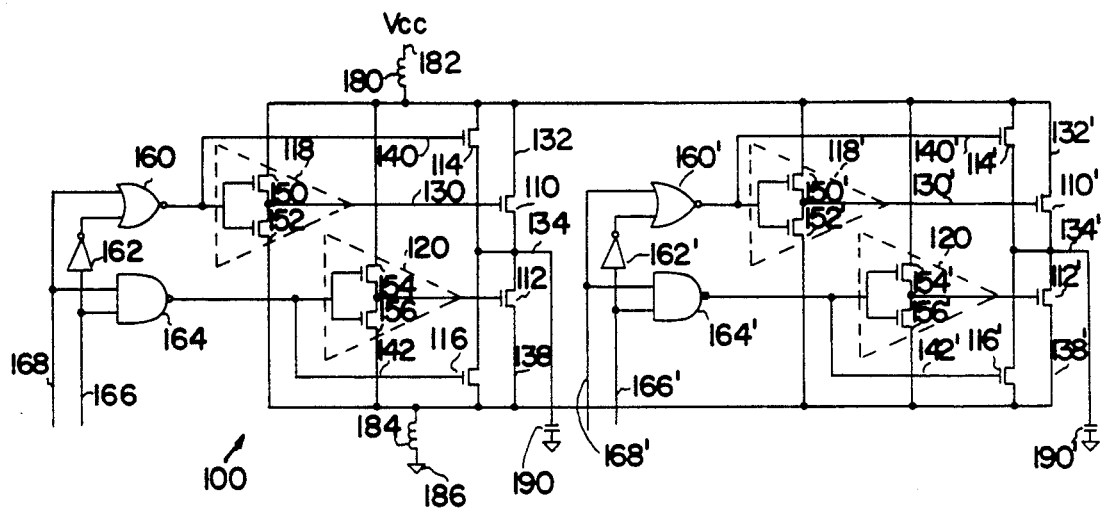
FIG. 1 is a circuit diagram of a prior art ground bounce controlled buffer.
Figure 2:
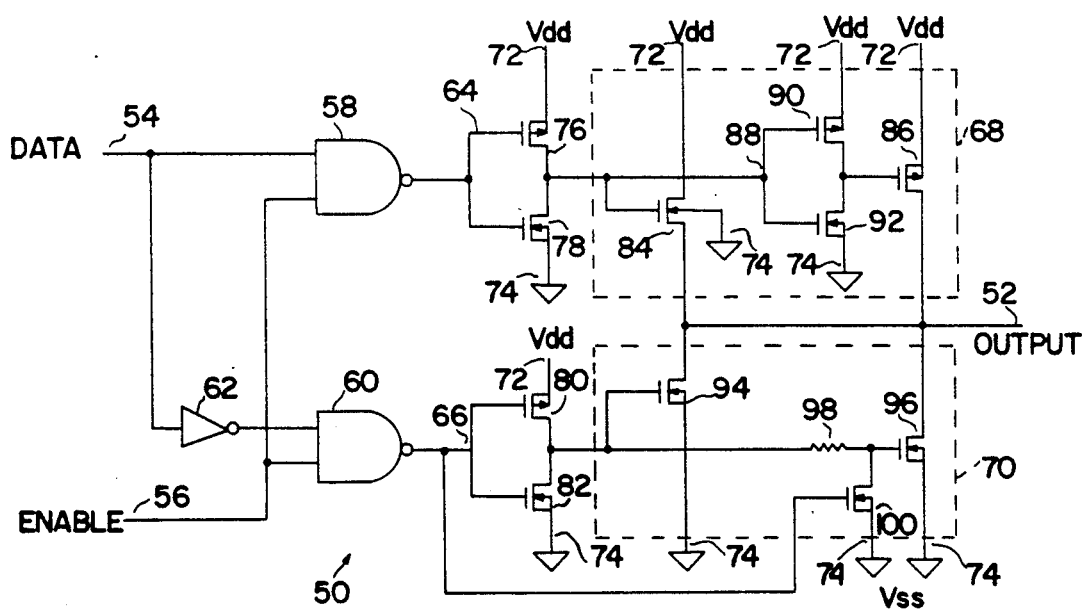
FIG. 2 is a circuit diagram of a prior art ground bounce controlled buffer.
Figure 3:
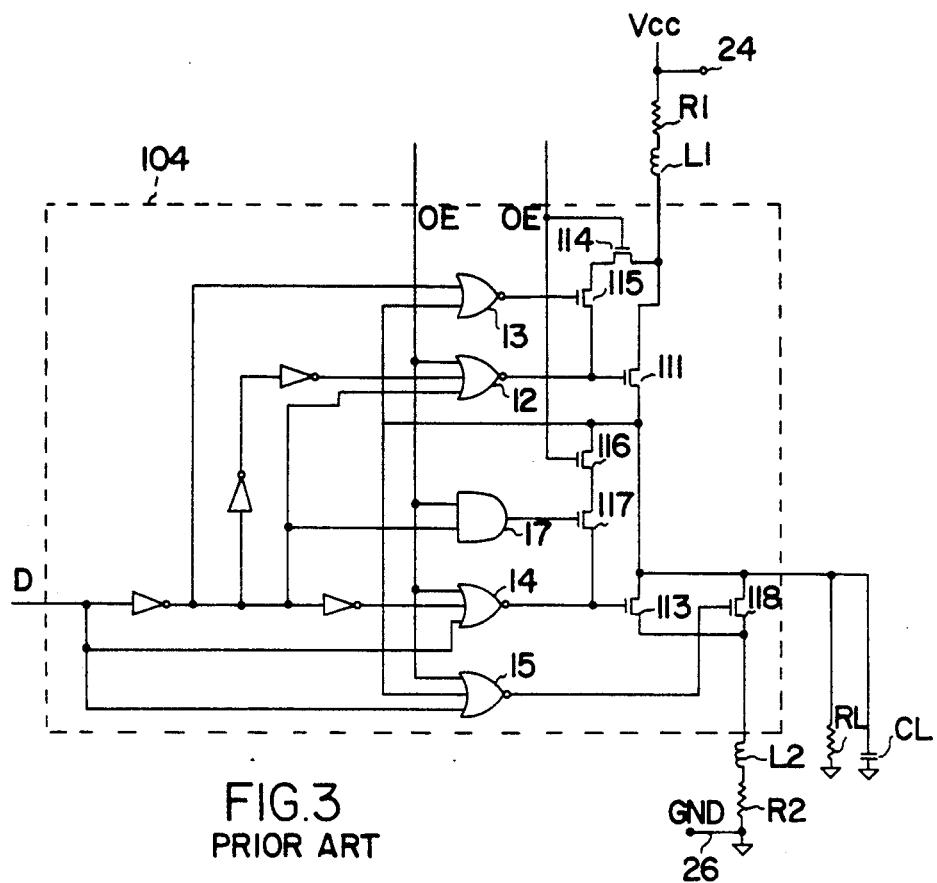
FIG. 3 is a circuit diagram of a prior art ground bounce controlled buffer.
Figure 4:
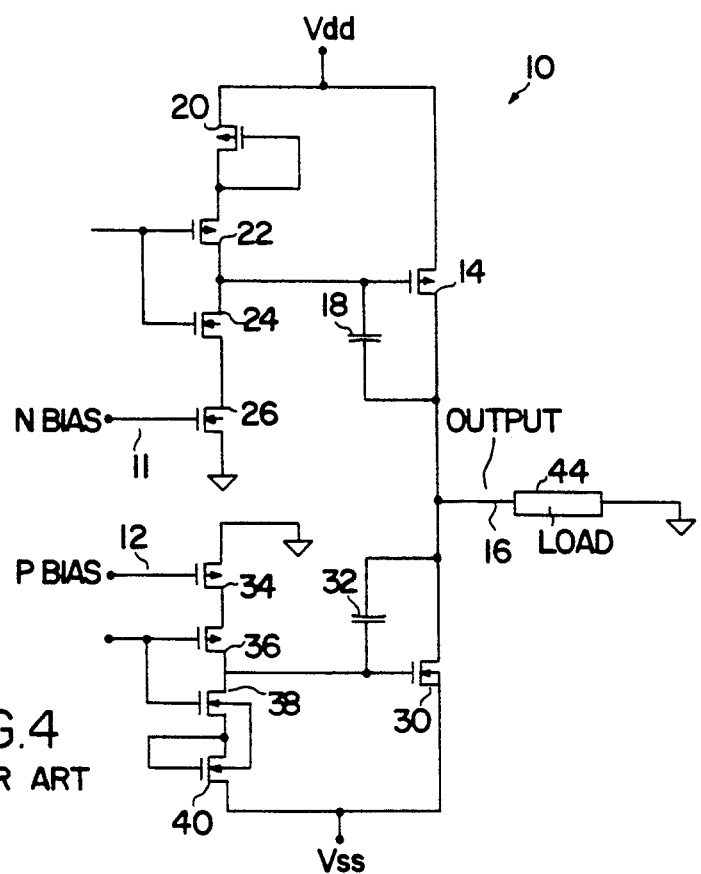
FIG. 4 is a circuit diagram of a prior art ground bounce controlled buffer.
Figure 5:
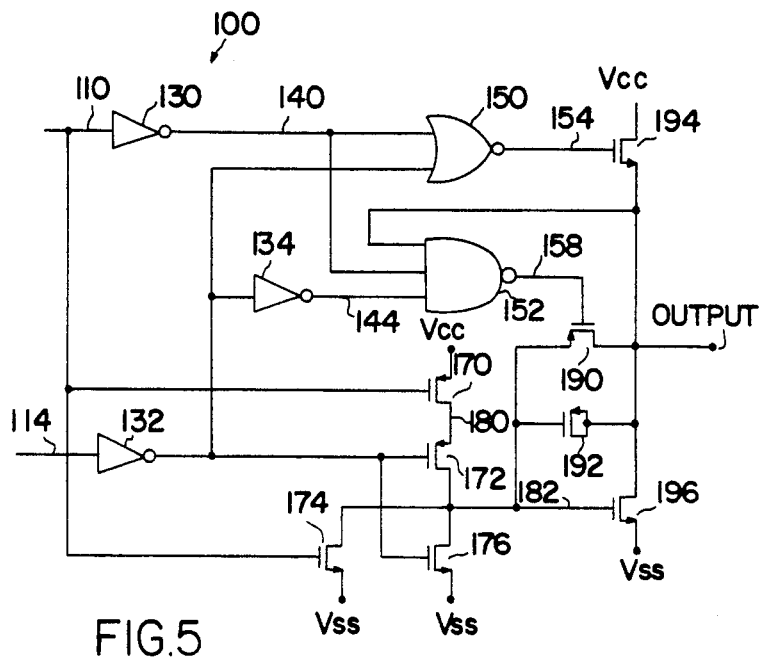
FIG. 5 is a circuit diagram of a ground bounce controlled buffer from a pending patent application.
Figure 6:
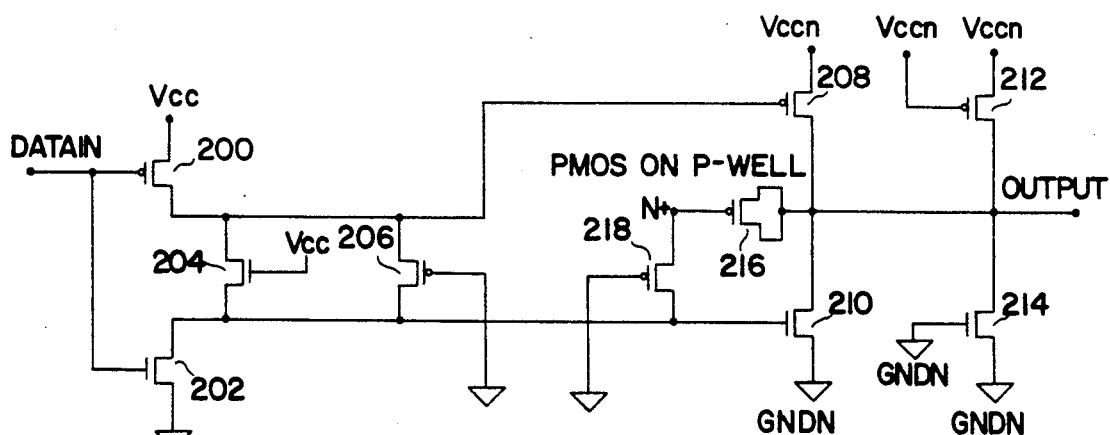
FIG. 6 shows a circuit diagram of a first embodiment of the present invention.

Referring to FIG. 6, a first pair of transistors 200 and 202 have their gates tied together to receive a DATAIN input signal. A second pair of transistors 204 and 206 act as resistive elements between the drains of transistors 200 and 202. A dual-output inverter is thus formed by the combination of transistors 200, 202, 204, and 206. Enough of a voltage drop is formed across transistors 204 and 206 that during a transition a transistor 208 is largely off as a transistor 210 turns on, and vice versa. This minimizes the flow of DC current across transistors 208 and 210 during a transition. Transistor 208 is the output pullup and transistor 210 is the output pulldown. A third pair of transistors 212 and 214 provide for electrostatic protection.

A transistor 216, in an N-substrate process, is a PMOS-in-pwell device with its source, drain, and well substrate tied together. The resulting 2-terminal device acts as a non-linear capacitor which turns off right after transistor 210 leaves the saturation region for the linear region. A transistor 218 has its gate tied to ground and it acts as a non-linear switch. The series combination of transistors 216 and 218 results in a non-linear Miller capacitor between the source and gate of transistor 210.

The equivalent input capacitance "Ci" presented by a pure Miller capacitor can be shown to be $Cm(1+gm+ZL)$, ZL being the load impedance while gm is the gain of transistor 210. Assuming momentarily that the predriver pullup current of transistor 200 is a constant Ip, the gate voltage, $Vg=Ip*t/[(1+gm*ZL)Cm]$. Since gm is proportional to Vg when transistor 210 is in saturation and $gm*ZL>>1$, then Vg is proportional to square-root of t ($\sqrt{t}$).

The combination of transistors 200, 202, 204, and 206 as a predriver is not a constant current source. For $Vg>VT$ (VT=threshold voltage), transistor 218 will be in its linear region. The current passing through it amounts to $k_4*(VT^2+2k_4*VT\sqrt{t}+k_4^2-Vx^2)$. Referring to FIG. 6, Vx must be of a form similar to Vg, e.g. $Vx=k_{18}+k_{19}\sqrt{t}$ in order for the system of simultaneous equations to converge on a solution. The current through transistor 218 is the same as the charging current running through transistor 216, thus the term $-Vx^2$ contains a linearly decreasing function of time which accounts for the non-constant nature of the predriver pullup current. The feedback network formed by transistors 210, 216, and 218 and the predriver combination of transistors 200, 202, 204, and 206, compensate for their own non-ideal characteristics.

The initial conditions of the circuit in FIG. 6 before a pulldown is initiated are such that the gate of transistor 210 is low and the output Vo is high. Transistor 216 is therefore on. Vg must jump to VT potential almost instantaneously after the predriver combination of transistors 200, 202, 204, and 206 tries to turn on transistor 210. If transistor 216 were left on during this period, its capacitive action would try to dampen the pullup effort—thus slowing the switching speed of transistor 210. But since transistor 218 is a PMOS device with its gate grounded, it can only pull Vx down to VTP', which is the threshold voltage of any PMOS transistor including body effect. In FIG. 6, Cm is therefore virtually invisible to the pulldown circuits until $Vg \approx VT$, and that is when $\sqrt{t}$ shaping commences.

The values of the components in the circuit are chosen to result in the desired maximum ground bounce, given a specific package. The values are also optimized to produce a maximally flat ground bounce, which automatically ensures the best speed attainable for the given circuit. The gain of transistor 210 can be made reasonably large and still allow ground bounce to be limited. This is true because Cg is proportional to the gain; given a fixed gate length, the channel width linearly determines both the gate area and the device transconductance. The feedback loop is such that the Cg and gain factors counterbalance each other, allowing a large $I_{OL}$ to be designed into the circuit without concern.

Figure 7:
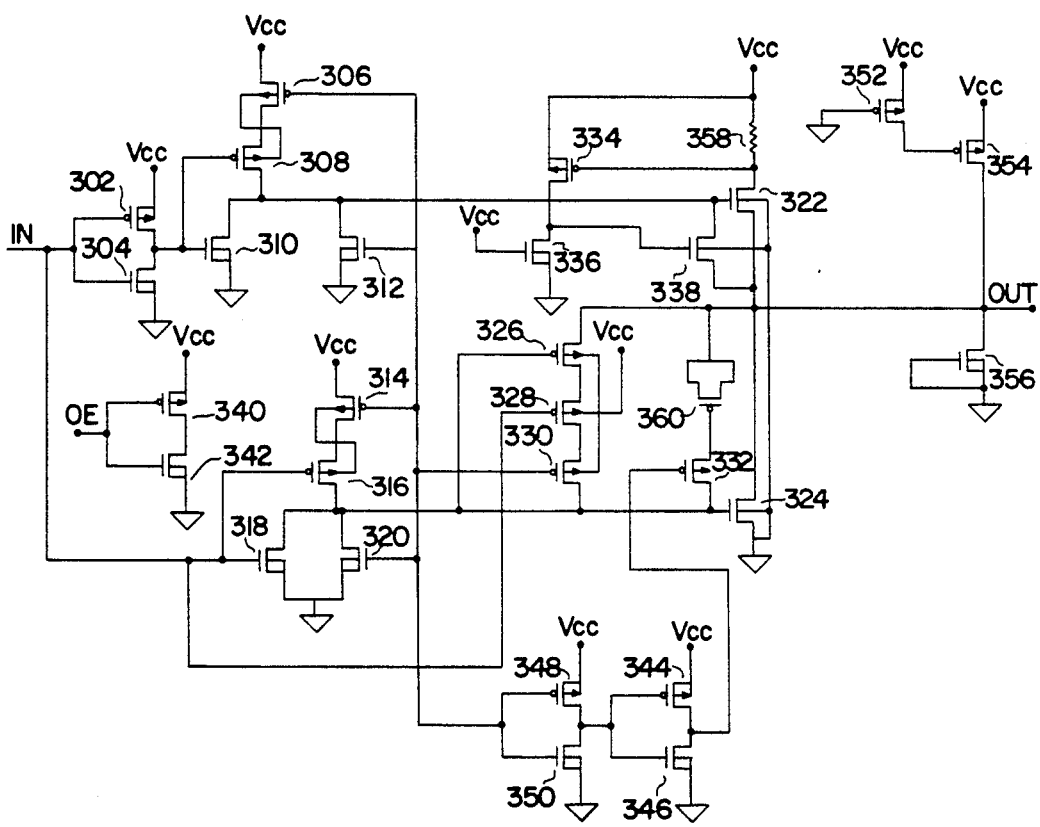
FIG. 7 shows a circuit diagram of a second embodiment of the present invention.

A second, more complex embodiment of the present invention is shown in FIG. 7. The CMOS predriver gates implement the logic required for tri-state operation and proper driver gate activation. A combination of four transistors, 314, 316, 318, and 320 form a predriver stage. A pair of transistors 322 and 324 form an output drive. The transistor 324 is a pulldown and is driven by the predriver stage of the combination of four transistors, 314, 316, 318, and 320.

A trio of transistors, 326, 328, and 330 form a first feedback path around transistor 324. A transistor 332 forms first part of a second feedback path around transistor 324. A combination of transistors 334, 336, and 338, together with a resistor 358 form a short circuit protection network for transistor 322. A transistor 360 forms a second part of the second feedback path around transistor 324.

Transistor 336 functions as a resistive element in series with transistor 334 and forms a PMOS inverter. Resistor 358 acts as a current sensor that feeds the voltage dropped across it to the PMOS inverter transistor 334. The output of the PMOS inverter serves to bleed-off charges from the gate of the pullup transistor 322 by discriminably turning on transistor 338.

The pulldown structure is similar to that presented in FIG. 6. The transistors 324, 360, and 332 in FIG. 7 are respectively similar to the group of transistors 210, 216, and 218 in FIG. 6. An additional and different feature of the feedback network of FIG. 7 is the series connection of the three transistors 326, 328, and 330 in parallel to the series combination of transistors 360 and 332.

Transistors 326, 328, and 330 ensure that Vg initially reaches VT fast. Transistor 330 implements a portion of the tri-state logic. These transistors operate as switches and share the charges from the output of transistor 324 to its gate. Transistor 328 is connected to the input of an inverting predriver (transistors 314, 316, 318, and 320), thus bypassing the inverting predriver's delay. Transistor 326 serves to shut off this charge sharing abruptly as Vg exceeds VT. This charge sharing approach eliminates the transients otherwise induced on Vcc, by simply choosing not to source from Vcc.

The device transconductance parameters essential for achieving the invention design goals are the transistors 314, 316, 332, 326, 328, 330, and 360. Transistor 324 is chosen to satisfy the $I_{OL}$ requirement, the value of which does not constrain the feedback circuitry for a given channel length. An assembly of transistors 352, 354, and 356 are required only for electrostatic discharge protection.

FIGS. 8A-D depict the ideal ground bounce controlled pulldown. The design objective of the circuits in FIGS. 6 and 7 is to limit ground bounce voltage $Vgb = L*di/dt$. Since L is a constant determined primarily by the package in use, it leaves the limiting amplitude di/dt. The amplitude di/dt need not necessarily be a constant—it can be a sine wave with amplitude k. However, because the QT/i minima occurs at $d^2i/dt^2 = 0$, the optimal speed will be obtained when $di/dt = k$.

Figure 8A:
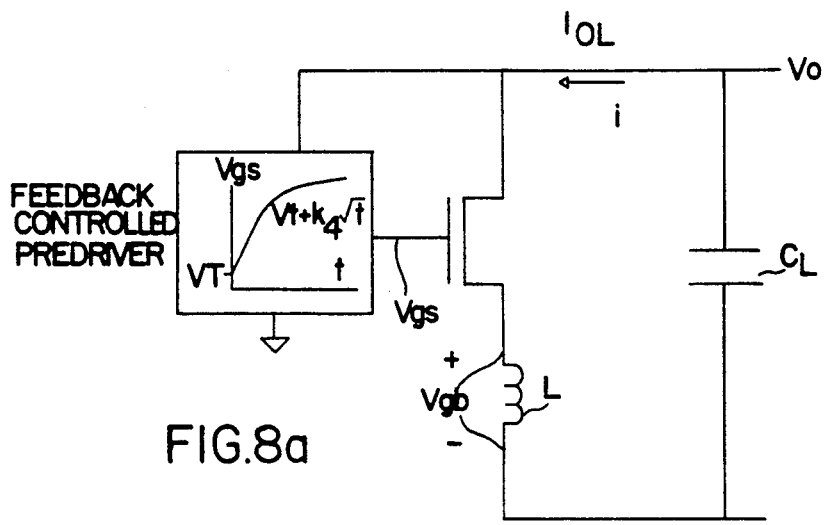
FIGS. 8A-D are an idealized circuit containing the present invention and waveforms relating to the ideal circuit.
Figure 8B:
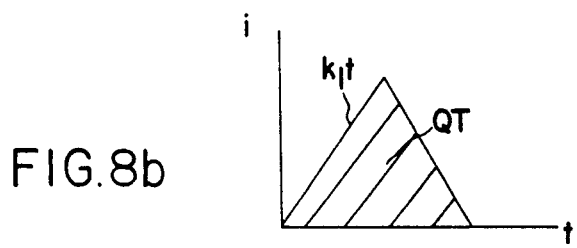

The pulldown current ideally should ramp up linearly from zero to a peak value and then ramp linearly back down to zero, forming a triangle wave as in FIG. 8B. The ground bounce voltage produced will be directly proportional to the slope of each ramp. Therefore, $I_{OL}$, FIG. 8A, can arbitrary be made large, since the present invention controls the rate of change of "i," regardless of the final DC value it can attain.

Figure 8C:
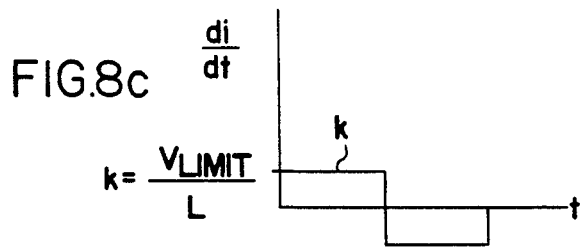
Figure 8D:
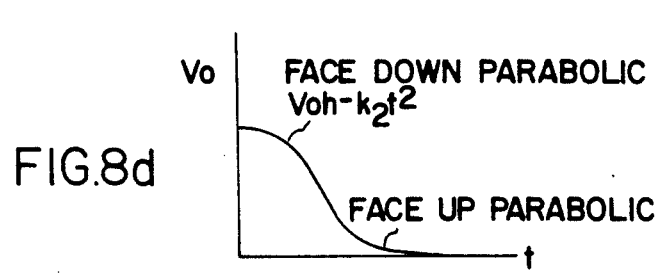

When the load is primarily capacitive, the output voltage VO is equal to $VOH - k_2 t^2$, a parabolic curve, FIG. 8C. Producing the triangular waveform of FIG. 8B requires the appropriately shaped voltage to be present on an NMOS pulldown transistor's gate (e.g., transistor 210 in FIG. 6, and transistor 324 in FIG. 7). The parabolic shape of VO allows the NMOS pulldown transistor to be in saturation for a large part of the output transition, where $i = k_3(Vgs - VT)^2$. Equating $k_1 t = k_3(Vgs - VT)^2$, yields $Vgs = VT + k_4 \sqrt{t}$.

The root of the present invention, therefore, is the shaping of Vgs so that it is proportional to the square root of time and shifted up by a constant VT.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A non-linear feedback controlled circuit comprising in combination:

a pulldown transistor, the pulldown transistor having an input gate and a drain;

a predriver transistor, the predriver transistor output driving said input gate of the pulldown transistor;

a feedback means, the feedback means being connected between said drain and said input gate of the pulldown transistor, the feedback means functioning as a non-linear Miller capacitance between said input gate and said drain of the pulldown transistor to directly trim the gate voltage of the pulldown transistor to yield a shifted square-root-of-time waveform;

whereby the ground bounce voltage at the output and source of the pulldown transistor is limited by controlling the time ramp of the pulldown transistor output current.

2. The non-linear feedback controlled circuit of claim 1 wherein:

the feedback means is comprised of a first feedback device and a second feedback device, said first feedback device being in series with said second feedback device and functioning like a non-linear capacitor which turns off right after the pulldown transistor leaves the saturation region for the linear region, said second feedback device functioning like a non-linear switch.

3. The non-linear feedback controlled circuit of claim 2 wherein:

said first feedback device is comprised of a PMOS-in-pwell device with its source, drain, and well substrate shorted together whereby the result is a 2-terminal device; and said second feedback device is comprised of a PMOS device with its gate grounded whereby the input gate of the PMOS-in-pwell device can only be pulled down to the threshold voltage of the PMOS device;

whereby an n-substrate process may be used to fabricate the feedback network.

4. The non-linear feedback controlled circuit of claim 2 further including:

a third feedback device and a fourth feedback device, said third feedback device and said fourth feedback device being coupled in series with one another and said third feedback device and said fourth feedback device being connected in parallel with said first and second feedback devices whereby output charges from the output of the pulldown transistor to the input gate of the pulldown transistor are shared, thus enabling gate voltage, Vg, to reach threshold voltage, VT, fast.

5. The non-linear feedback controlled circuit of claim 4 wherein:

the third feedback device is comprised of a transistor having a gate, a drain, and a source, said gate of the third feedback device being connected to the source of the predriver transistor and the gate of the pulldown transistor, whereby the third feedback device serves to abruptly shut off a charge as Vg exceeds VT; and the gate of the fourth feedback device is connected to the input of an inverting predriver whereby said predriver's delay is bypassed.

6. A non-linear feedback controlled circuit comprising in combination:

a pulldown transistor, the pulldown transistor having an input gate and a drain;

a predriver transistor, the predriver transistor output driving the input gate of the pulldown transistor;

a feedback means, the feedback means being connected between said drain and said input gate of the pulldown transistor, the feedback means comprised of a first feedback device, a second feedback device, a third feedback device and a fourth feedback device, said first feedback device functioning like a non-linear capacitor which turns-off right after the pulldown transistor leaves the saturation region for the linear region, said second feedback device functioning like a non-linear switch, said third feedback device and said fourth feedback device being coupled in series with one another and said third feedback device and said fourth feedback device being connected in parallel with said first and second feedback devices, said first feedback device being in series with said second feedback device, whereby the gate voltage of the pulldown transistor may be directly trimmed to yield a shifted square-root-of-time waveform;

said first feedback device is comprised of a PMOS-in-pwell device with its source, drain, and well substrate shorted together whereby the result is a 2-terminal device that acts like the non-linear capacitor; and said second feedback device is comprised of a PMOS device with its gate grounded whereby said input gate of the PMOS-in-pwell device can only be pulled down to the threshold voltage of the PMOS device;

said third feedback device is comprised of a transistor having a gate, a drain, and a source, said gate of the third feedback device being connected to said drain of the predriver and said gate of the pulldown transistor, whereby said third feedback device serves to abruptly shut off a charge as Vg exceeds VT; and said fourth feedback device is connected to the input of an inverting predriver whereby the predriver's delay is bypassed;

whereby the ground bounce voltage at the output and source of the pulldown transistor is limited by controlling the time ramp of the pulldown transistor's output current.

7. The non-linear feedback controlled circuit of claim 6 further including:

a CMOS predriver stage;

a means to implement tri-state operation;

a means to implement proper driver-gate activation after tri-stating;

an NMOS pullup transistor;

a means to protect the NMOS pullup transistor from short circuits, said means comprised of a current sensor means and a bleed-off means;

a fifth feedback device in series with both said third feedback device and said fourth feedback device, whereby tri-stating is provided for; and a means to protect the non-linear feedback controlled circuit from electrostatic discharge.

8. The non-linear feedback controlled circuit of claim 2 wherein:

said first feedback device is comprised of a NMOS-in-nwell device with its source, drain, and well substrate shorted together whereby the result is a 2-terminal device; and said second feedback device is comprised of a NMOS device with its gate grounded whereby the input gate of the NMOS-in-nwell device can only be pulled down to the threshold voltage of the NMOS device;

whereby a p-substrate process may be used to fabricate the feedback network.

* * * * *

UNITED STATES PATENT AND TRADEMARK OFFICE
CERTIFICATE OF CORRECTION

PATENT NO.   :   5,028,818
DATED        :   July 2, 1991
INVENTOR(S)  :   Go Ang, et al.

It is certified that error appears in the above-identified patent and that said Letters Patent is hereby corrected as shown below:

Title page, Item [19] should read --Ang--.

Inventor's name now reads "Mivhsrl A. Ang".

Signed and Sealed this

Twenty-ninth Day of December, 1992

Attest:

DOUGLAS B. COMER

*Attesting Officer*      Acting Commissioner of Patents and Trademarks

UNITED STATES PATENT AND TRADEMARK OFFICE
CERTIFICATE OF CORRECTION

PATENT NO. : 5,028,818
DATED : July 2, 1991
INVENTOR(S) : Go Ang, et al.

It is certified that error appears in the above-indentified patent and that said Letters Patent is hereby corrected as shown below:

Title page, Item [19] should read --Ang--.

Inventor's name now reads "Michael A. Ang".

This certificate supersedes Certificate of Correction issued December 29, 1992.

Signed and Sealed this

Ninth Day of November, 1993

Attest:

BRUCE LEHMAN

*Attesting Officer*       *Commissioner of Patents and Trademarks*